US012812821B2

(12) United States Patent
Chabillant et al.

(10) Patent No.: US 12,812,821 B2
(45) Date of Patent: Nov. 24, 2026

(54) ELECTRONIC CONTROL UNIT FOR A VEHICLE, ELECTRIC POWER STEERING SYSTEM AND VEHICLE WITH A HEAT SINK DESIGNED MONOLITHICALLY WITH A HOUSING

(71) Applicant: Hella GmbH & Co. KGaA, Lippstadt (DE)

(72) Inventors: Kevin Chabillant, Toulouse (FR); Helene Galaup, Toulouse (FR)

(73) Assignee: Hella GmbH & Co. KGaA, Lippstadt (DE)

( * ) Notice: Subject to any disclaimer, the term of this patent is extended or adjusted under 35 U.S.C. 154(b) by 313 days.

(21) Appl. No.: 18/451,905

(22) Filed: Aug. 18, 2023

(65) Prior Publication Data

US 2023/0397379 A1 Dec. 7, 2023

Related U.S. Application Data

(63) Continuation of application No. PCT/EP2021/054364, filed on Feb. 23, 2021.

(51) Int. Cl.

| | |
|---|---|
| ***H05K 7/20*** | (2006.01) |
| ***B62D 5/04*** | (2006.01) |
| ***H02K 5/06*** | (2006.01) |
| ***H02K 9/22*** | (2006.01) |
| ***H05K 5/06*** | (2006.01) |

(52) U.S. Cl.

CPC ....... *H05K 7/20854* (2013.01); *B62D 5/0406* (2013.01); *H02K 5/06* (2013.01); *H02K 9/227* (2021.01); *H05K 7/2039* (2013.01); *H05K 7/209* (2013.01); *H05K 2201/066* (2013.01)

(58) Field of Classification Search

CPC .. H05K 7/2039; H05K 7/20854; H05K 7/209; H05K 2201/066; H05K 5/04; H02K 5/04; H02K 5/06; H02K 9/22; H02K 9/227; B62D 5/0406; B62D 5/0409; B62D 5/0457

See application file for complete search history.

(56) References Cited

U.S. PATENT DOCUMENTS

| | | | | |
|---|---|---|---|---|
| 2015/0180316 | A1 | 6/2015 | Maeshima | |
| 2018/0115225 | A1* | 4/2018 | Togawa ................. | H02K 9/227 |
| 2018/0248451 | A1 | 8/2018 | Hagiwara | |
| 2019/0140520 | A1* | 5/2019 | Sato ........................ | H02K 11/33 |
| 2019/0241209 | A1 | 8/2019 | Jocham et al. | |
| 2020/0391785 | A1 | 12/2020 | Kim et al. | |

(Continued)

FOREIGN PATENT DOCUMENTS

| | | | |
|---|---|---|---|
| DE | 102007014645 | A1 | 10/2008 |
| WO | 2020090569 | A1 | 5/2020 |

*Primary Examiner* — Jayprakash N Gandhi
*Assistant Examiner* — Steven Ngo
(74) *Attorney, Agent, or Firm* — Husch Blackwell LLP

(57) ABSTRACT

An electronic control unit for a vehicle is provided, with a housing, a heat sink and at least one printed circuit board. The housing is configured to be provided with an electric unit to be electrically connected to the at least one printed circuit board. The at least one printed circuit board is in close vicinity to at least one heat conduction surface of the heat sink. The heat sink is designed monolithically with the housing such that the heat sink is configured to conduct heat generated by the at least one printed circuit board to the housing.

14 Claims, 5 Drawing Sheets

(56) References Cited

U.S. PATENT DOCUMENTS

| | | | | |
|---|---|---|---|---|
| 2023/0081123 | A1* | 3/2023 | Morimoto | H02K 11/02 310/71 |
| 2023/0118691 | A1* | 4/2023 | Morimoto | B62D 5/0406 310/71 |
| 2023/0179070 | A1* | 6/2023 | Morimoto | B62D 5/0406 310/64 |

* cited by examiner

ELECTRONIC CONTROL UNIT FOR A VEHICLE, ELECTRIC POWER STEERING SYSTEM AND VEHICLE WITH A HEAT SINK DESIGNED MONOLITHICALLY WITH A HOUSING

CROSS REFERENCE

This application claims priority to PCT Application No. PCT/EP2021/054364, filed Feb. 23, 2021, the entirety of which is hereby incorporated by reference.

FIELD OF THE INVENTION

The invention is directed to an electronic control unit for a vehicle, an electric power steering system and a vehicle.

BACKGROUND OF THE INVENTION

In an electric power steering system, an electronic control unit can be connected with an electric motor for supplying power to the electric motor from a power source such as a battery. The electric power steering system can assist in a handling operation, typically a steering, of a transportation equipment, by either a driver or a machine in an autonomous vehicle. The transportation equipment can be an automobile.

The electric power steering system may further comprise a torque sensor, a steering shaft, a handle, typically a steering wheel, and the power source. In the following, a typical arrangement and operation of the electric power steering apparatus in an automobile will be described. This exemplary arrangement may in parts or entirely also be adopted by the invention.

The torque sensor may be mounted on the steering shaft. Upon rotating the steering shaft by operating the handle, the torque sensor detects a torque being applied to the steering shaft by the operation of the handle. Upon detection of the torque by means of the torque sensor, a torque signal is output from the torque sensor to the electronic control unit. The electronic control unit then drives the electric motor based at least on the torque signal. Optionally, the control device may include further data such as vehicle speed in addition to the torque signal for controlling the driving of the electric motor.

The electronic control unit drives the electric motor by supplying a driving current from the power source, such as the battery of the automobile, to the electric motor. A driving force generated from the electric motor is then transmitted to the wheels directly or via a gearbox depending on the configuration in the automobile. As a result, the electric power steering apparatus changes a steering angle of the wheels by amplifying the torque of the steering shaft by means of the electric motor. This enables the driver to operate the handle with less force.

The electronic control unit comprises a power board electrically connected with the electric motor. The power to the electric motor is transmitted via this power board. A logic board may be connected to this power board for controlling the transmission of power to the electric motor. The power board generates heat during operation of the electronic control unit. To prevent overheating and damage of the electronic control unit, a heat sink may be provided inside of the electronic control unit and arranged in thermal contact with a housing of the electric power steering system or electric motor.

It is difficult to get a compact assembly having the respective boards electronically connected to each other while providing the assembly with enough space for the boards, electronic components thereof and the heat sink. Also, the heat generated by the power board must be effectively dissipated via the heat sink.

US 2019/0241209 A1 describes an electric power steering apparatus, in which the heat sink is at least partially connected to the motor housing by calking or welding or screwing. Thereby, the dissipation of heat from the heat sink via the motor housing is facilitated.

However, it is still cumbersome to manufacture such connection of the heat sink by means of calking, welding or screwing it with the motor housing of that apparatus.

BRIEF SUMMARY OF THE INVENTION

Therefore, it is an objective of the present invention to provide an electronic control unit for a vehicle, in particular for an electric power steering system, having improved manufacturability, packaging of the components inside of the housing and heat dissipating characteristics.

This objective is solved by the claims. Therefore, this objective is solved by an electronic control unit, an electric power steering system, and a vehicle as described herein. The features and details described in connection the electronic control unit of the invention apply in connection with the electric power steering system and the vehicle as well as the other way around, so that regarding the disclosure of the individual aspects of the invention, it is or can be referred to one another.

According to a first aspect of the invention, the above objective is solved by an electronic control unit for a vehicle, in particular for an automobile. The electronic control unit comprises a housing, a heat sink and at least one printed circuit board. The housing is configured to be provided with an electric unit to be electrically connected to the at least one printed circuit board. The at least one printed circuit board is in close vicinity to at least one heat conduction surface of the heat sink. The heat sink is designed monolithically with the housing such that the heat sink is configured to conduct heat generated by the at least one printed circuit board to the housing.

According to the invention, the housing of the electronic control unit is designed or manufactured monolithically with the heat sink. In other words, the heat sink and housing are designed monolithically. This means, that the heat sink and housing are originally manufactured as one single piece or, in other words, monobloc and from the same material. Therefore, the housing and the heat sink are manufacturable in a single step. Compared to separately manufacturing them and consequently connecting them to each other as suggested in the prior art, this saves time and cost for the manufacturing. For example, when welding the housing and heat sink together, they are not designed monolithically or as monobloc but separate from one another and only joined consequently. Such welding results in a different shape and structure of the material compared to a monobloc design.

Also, the conduction of heat from the heat sink to the housing may be improved over a connection, such as screwing or welding, where the heat conduction is not optimal due to the need to conduct the heat via screws or non-optimal geometric portions of the welding seam.

Moreover, the housing and heat sink with the solution of the invention are not limited in terms of material choice compared to the prior art solutions. For example, the welding option is limited to specific metals.

Finally, the monobloc design of the housing and the heat sink allows for better packaging of the components of the electronic control unit inside the housing and with respect to the heat sink due to the integral design and the elimination of connection parts, such as the screws or the welding seam.

In the electronic control unit of the invention, the heat is transported from inside of the electronic control unit, where it is generated, to the housing. The housing can be provided with a much larger surface than the heat sink itself. The heat transported thereto may thus dissipate faster and easier at the housing. Further, the housing may be efficiently cooled by means of the ambient air, for example.

Of course, other components inside of the housing, in particular near the at least one printed circuit board and/or electronic components such as capacitors or coils, which may be configured to conduct heat directly or via the at least one printed circuit board to the housing.

In particular, the at least one printed circuit board may be a power board for conducting current to the electric unit to be connected thereto. In other words, the electronic control unit may have the at least one printed circuit board designed as at least one power board. The at least one power board may be configured for providing energy from an energy source, such as a battery, to the electric unit. Also, the at least one power board may be electrically connected via one or more connectors to the electric unit for forwarding the power or current received from the energy source to the electric unit. Further, the at least one power board may comprise electronic components such as coils and capacitors for enabling the power board to transmit the power from a power source to the electric motor.

The electronic control unit may further comprise a logic board. The logic board may in particular be provided as a printed circuit board. The logic board does not have to be attached to the heat sink. In particular, the logic board may not be (directly) attached to the heat sink. The logic board in operation of the electronic control unit generates less heat than the at least one power board and thus it may be prioritized that the at least one power board that is generating more heat in operation of the electronic control unit is attached to the heat sink.

Also, the electronic control unit may comprise a connector system, such as a connector plate, for example. The connector system may have a housing made from plastic, for example. The connector system may be formed as a cap for sealing the housing at an end thereof. The connector system may be provided with a sealing for sealing the inside of the housing against the outside. The sealing may be made from a silicone rubber. The connector system may comprise one, two, three or more connectors, in particular plug connectors. At or inside of the plug connectors, the connector system may be provided with electrical contacts. The electrical contacts may be made from a copper alloy, for example, to provide high electrical conductivity. One or multiple of the plug connectors may be provided for contacting a control board of the transportation equipment with the logic board. Thereby, the torque sensor, other sensors and/or other electronic control units may be connected to the logic board. These plug connectors may be connected by means of power connectors to the at least one power board.

Although the invention is generally directed at an electronic control unit for a vehicle having an electric unit, the invention is particularly suitable and therefore may be used for an electronic control unit being configured as an electronic control unit of an electric power steering system, such as the electric power steering apparatus explained in the introductory part of this specification. The electric unit is an electric motor in this case. The electric motor is provided in the housing, in particular attached to the housing. The housing may accordingly also be referred to as a motor housing.

The heat sink and the housing may be made from the same metal. Thereby, the heat sink and the housing are made from a monobloc of metal. Metal as a heat-conducting material is particularly suitable for the heat conduction. The metal may comprise or be aluminum, magnesium, copper or similar, for example. The monobloc manufacturing of the heat sink with the housing may be achieved by means of die-casting or molding, for example.

In particular, the at least one printed circuit board may be provided with a heat conduction surface corresponding to the at least one heat conduction surface of the heat sink and that heat conduction surface of the at least one printed circuit board may be arranged parallel in the close vicinity to the at least one heat conduction surface of the heat sink.

Further, the at least one printed circuit board may be attached, in particular via a thermal interface material, to the at least one heat conduction surface of the heat sink. In other words, the at least one printed circuit board may be in contact with the at least one heat conduction surface but that contact does not to be direct but may be provided via another material located in between the printed circuit board and the heat conduction surface of the heat sink, such as the mentioned thermal interface material. Preferably, only a thermal interface material is provided in between the at least one printed circuit board and the at least one heat conduction surface of the heat sink. The thermal interface material, such as a heat-conducting paste, for example, may be provided between the at least one printed circuit board and the heat sink at the heat conduction surface to thermally attach the respective parts with each other for better thermal conductivity. Accordingly, when the description talks about attachment of the at least one printed circuit board to the at least one heat conduction surface, contrary to a direct attachment, no direct attachment is required but instead there may be the mentioned layer of material, such as the thermal interface material, in between such that an indirect attachment or contact is provided. That indirect attachment preferably is provided by no more than one part or material, in particular the mentioned thermal interface material.

Moreover, the electronic control unit may comprise two printed circuit boards. In particular, these may be designed as power boards. The two printed circuit boards may be directly electrically connected to each other and/or may be separately connected to the electric unit. Connectors may be used for this purpose. Also, each one of the two printed circuit boards may be attached, in particular via the thermal interface material, to at least one heat conduction surface of the heat sink.

In an embodiment, in which the two printed circuit boards are power boards of an electronic control unit of an electric power steering system, the two power boards may each be provided as redundant power boards for supplying the electric motor independently from one another with power. Both power boards may be arranged each with three phases of electricity to supply three-phase electric power to the electric motor. Together, a first power board and a second power board may thus be arranged to supply six phases of electricity to the electric motor. The first power board may be provided on one side of the heat sink and the second power board may be provided on another side of the heat sink. The first power board and the second power board may be directly or indirectly, in particular with the thermal interface material provided in between, attached with their circuit board and electronic components to the heat sink.

The heat sink may be sandwiched between the two printed circuit boards. Also, each one of the two printed circuit boards may be in close vicinity to a separate one of two heat conduction surfaces of the heat sink. Thereby, a design is achievable, in which the heat conduction surfaces are located on opposite sides of the heat sink. Thereby, the heat from the printed circuit boards can be conducted via the heat sink to the housing by heat conduction surfaces on the opposite sides of the heat sink, which makes better use of the entire body of heat sink available for cooling. Also, it is possible, that electronic components of the first power board and electronic components of the second power board are facing towards the heat sink.

Moreover, the heat conduction surfaces may be arranged diagonally opposite each other. In other words, the heat conduction surfaces may be arranged such that they are not parallel to each other but diagonally opposed to each other. Also, or alternatively, the heat conduction surfaces may be located at different widths or, in other words, positions along the width of the housing. The width of the housing is measured in the direction perpendicular to its length or, in other words, longitudinal extension. By providing such a design, in which the heat conduction surfaces diagonally oppose each other and/or are located at different width positions along a width measured along the housing, the heat conduction characteristics may further be improved due to better use of the available body or, in other words, volume of the heat sink available for dissipating the heat to the housing and from there to the ambient air.

Moreover, the heat conduction surfaces may be located in separate heat conduction portions of the heat sink. By providing the heat conduction surfaces in heat conduction portions, which are separate from one another, in particular by having an intermediate portion of the heat sink in between the separate heat conduction portions, which is not opposite or parallel of a heat conduction surface, the heat conductivity characteristics of the heat sink may even further be improved. The intermediate portion of the heat sink may in particular extend along the length of the housing. In particular, the intermediate portion may extend in length in a direction perpendicular to the extension direction of the separate heat conduction portions having the heat conduction surfaces. The intermediate portion thus serves the function of thermally connecting the two separate heat conduction portions.

Also, the heat sink may comprise recesses and/or grooves, into which electronic components of the at least one printed circuit board are projecting. Thereby, it may be provided, that the electronic components extend toward the heat sink and inside the recesses and/or grooves. By introducing the electronic components of the at least one printed circuit board inside corresponding recesses and/or grooves, the packaging of the electronic control unit can be effectively reduced.

Further, at least one cut-out in between the housing and the heat sink for a connector of the electronic control unit may be provided. The at least one connector may be any one or multiple of the previously described connectors, e. g. a connector from a printed circuit board to a printed circuit board or the electric unit or from a logic board to a printed circuit board. Thereby, the heat sink may be provided with a comparatively large body or volume despite providing respective connectors.

Finally, it is an advantageous design, when the housing has a cylindrical shape or a substantially cylindrical shape and/or the heat sink has a substantially circular plate-like shape.

According to a second aspect of the invention, the above-mentioned object is solved by means of an electric power steering system comprising the electronic control unit, whereby the electric unit is an electric motor provided inside the housing and electrically connected to the at least one printed circuit board, in particular power board.

As indicated above, the use of the electronic control unit according to the first aspect of the invention in the electric power steering system of the second aspect of the invention is only an exemplary field of application in a vehicle, which, however, is preferred.

In a configuration with two printed circuit boards as power boards, i. e. the first power board and the second power board, the electric motor may be electrically connected by means of a first electric motor connector to the first power board and by means of a second electric motor connector to the second power board. Each of the power boards may supply a three-phase electric current. The electric motor may thus be designed as a six-phase electric motor. Thereby, the electric motor can be separately driven by the driving current supplied separately by any one or both of the two power boards. This provides for a redundant and failure unsusceptible design of the electronic control unit and the electric power steering system.

The electric power steering system may further comprise a torque sensor, a steering shaft, a handle, in particular a steering wheel, and a power source. The electric power steering system may further have the arrangement and be arranged for operation in a vehicle, in particular an automobile, as described in the introductory part of this description.

According to a third aspect of the invention, the above-mentioned object is solved by means of a vehicle, in particular an automobile, comprising the electronic control unit according to the first aspect of the invention or the electric power steering system according to the second aspect of the invention.

Further advantages, features and details of the invention unfold from the following description, in which by reference to drawings of the following Figures the present invention is described according to one possible example. Thereby, the features from the claims as well as the features mentioned in the description can be essential for the invention as taken alone or in an arbitrary combination.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Throughout the FIGS. 1 to 5, alike reference numbers are used for the same parts.

Figure 1:
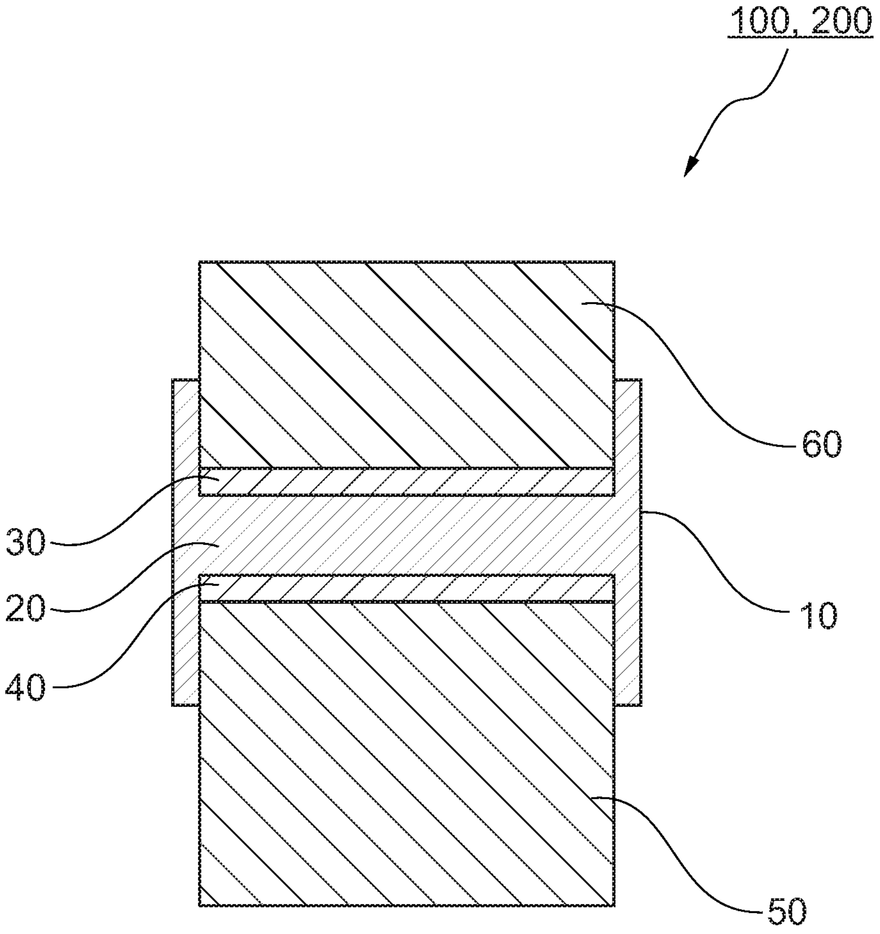
FIG. 1 is a schematic representation of an exemplary electric power steering system according to the invention.

FIG. 1 shows an exemplary electronic control unit 100 in an electric power steering system 200 according to the invention. FIG. 1 shows the components of the electronic control unit 100 in a type of blackbox or schematic representation such that the general structure of the electric power steering system 200 of the invention according to this example with some but not all components may be identified.

The electronic control unit 100 in this example comprises two printed circuit boards 30, 40 configured as power boards 30, 40. The two power boards 30, 40 are sandwiching the heat sink 20. The heat sink 20 is monolithically designed with the housing 10 surrounding the two power boards 30, 40. The housing 10 and heat sink 20 are made from the same metal. At the upper end of the housing 10, a connector system is attached to the housing 10. The connector system 60 may forward the current to an electric motor 50 via the power boards 30, 40 and further provide control signals to a logic board, which may be also provided in the electronic control unit 100, as previously explained in this specification, but for the sake of simplicity is not shown in the drawings At the bottom end of the housing 10, an electric unit 50 in the form of the electric motor 50 is attached to the housing 10 and also electrically connected to both power boards 30, 40 of the electronic control unit 100, thereby effectively forming the electric power steering system 200 shown in FIG. 1.

Figure 2:
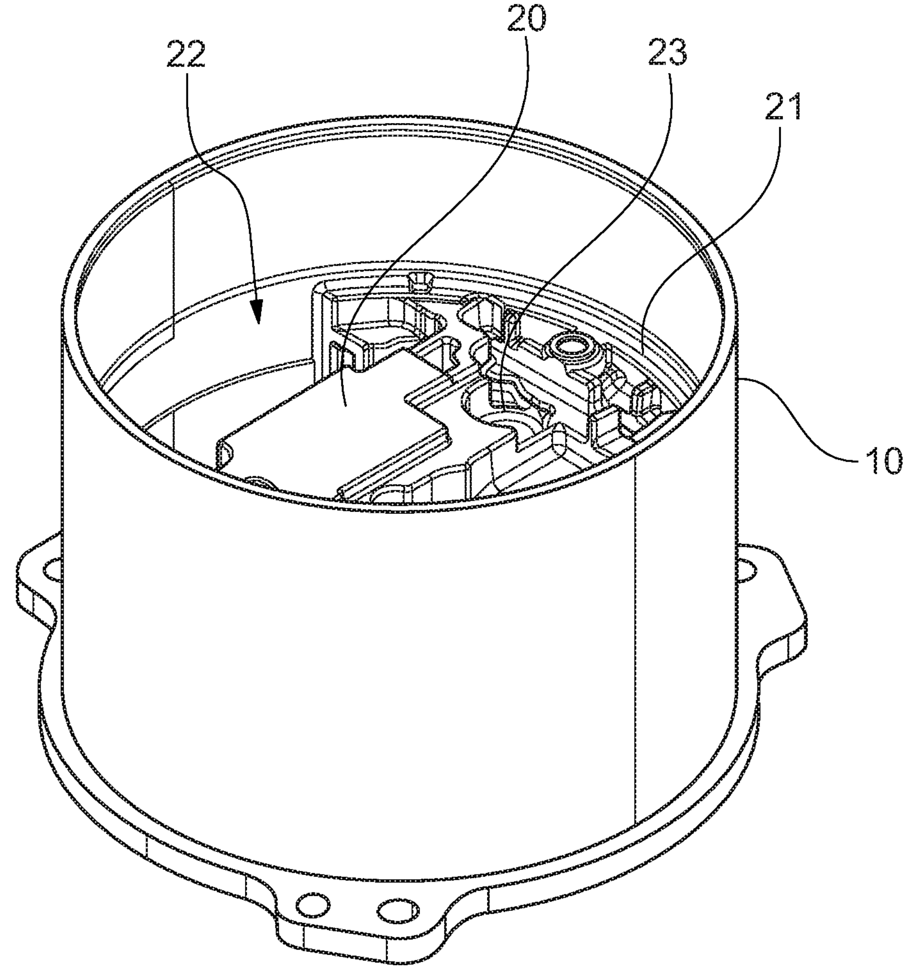
FIG. 2 is a perspective view on a housing integrally formed with a heat sink of the electric power steering system of FIG. 1.

FIG. 2 shows a detailed view on an exemplary housing 10 with the monolithically formed heat sink 20 of the electric power steering system 200 of FIG. 1.

Figure 3:
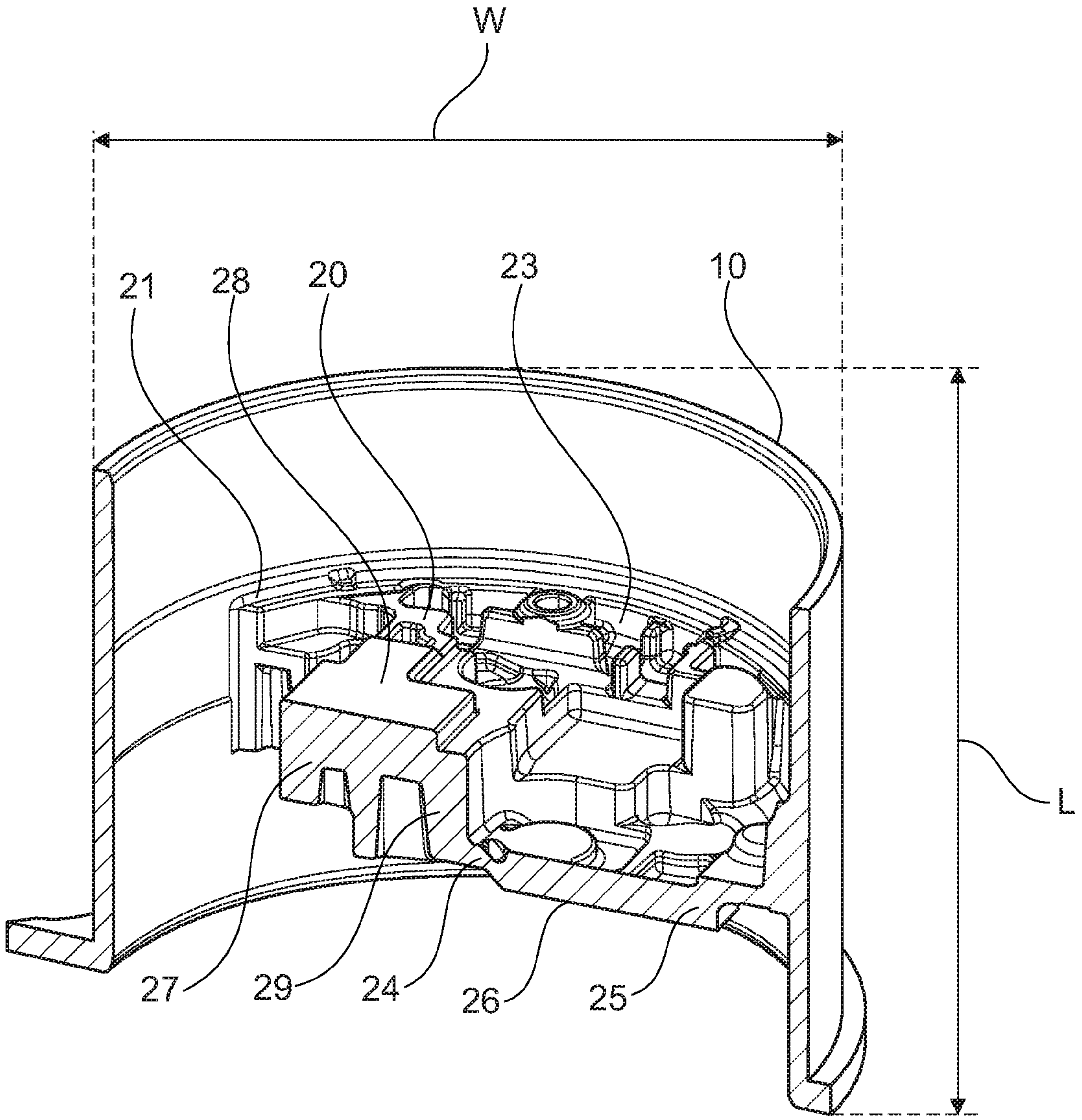
FIG. 3 is a perspective view on a partial cut of the housing of FIG. 2.

FIG. 3 shows the same component as FIG. 2 but in a partial cut thereof such that the heat sink 20 and housing 10 are seen with their cross-section 29 along a width W of the housing 10.

As may be taken from FIG. 2 and FIG. 3, in this particular example, the heat sink with its outer circumference 21 is not entirely connected to the housing 10 but has a cut-out 22 for introducing therein one or more connectors (not shown) for connection of any part above the heat sink 20 with the second power board 40 and/or the electric motor 50. Accordingly, this connector or these connectors are advantageously provided between the housing 10 and the heat sink 20 despite them being integrally formed with each other.

Further, the heat sink 20 comprises recesses and/or grooves 23, of which only one seen in FIG. 3 is exemplary denominated. This allows electronic components of the power boards 30, 40 to project inside of the heat sink 20, thereby enabling good packaging of the entire electronic control unit 100. Also, recesses 23 inside the heat sink 20 may be provided for one or more of the above-mentioned connectors.

The cross-section 29 of the heat sink 20 at the heat conduction surfaces 26, 28 of the heat sink 20 has a substantially z- or s-type shape. In particular, the heat sink 20 has two heat conduction portions 25, 27, at which the heat conduction surfaces 26, 28 are respectively provided. The heat conduction surfaces 26, 28 are provided on the heat sink 20 such that they are diagonally opposed to each other and provided at different widths W or positions of width W of the housing 20. Also, the heat conduction surfaces 26, 28 of the heat sink 20 are provided at different lengths L or positions of length L of the housing 10.

Figure 4:
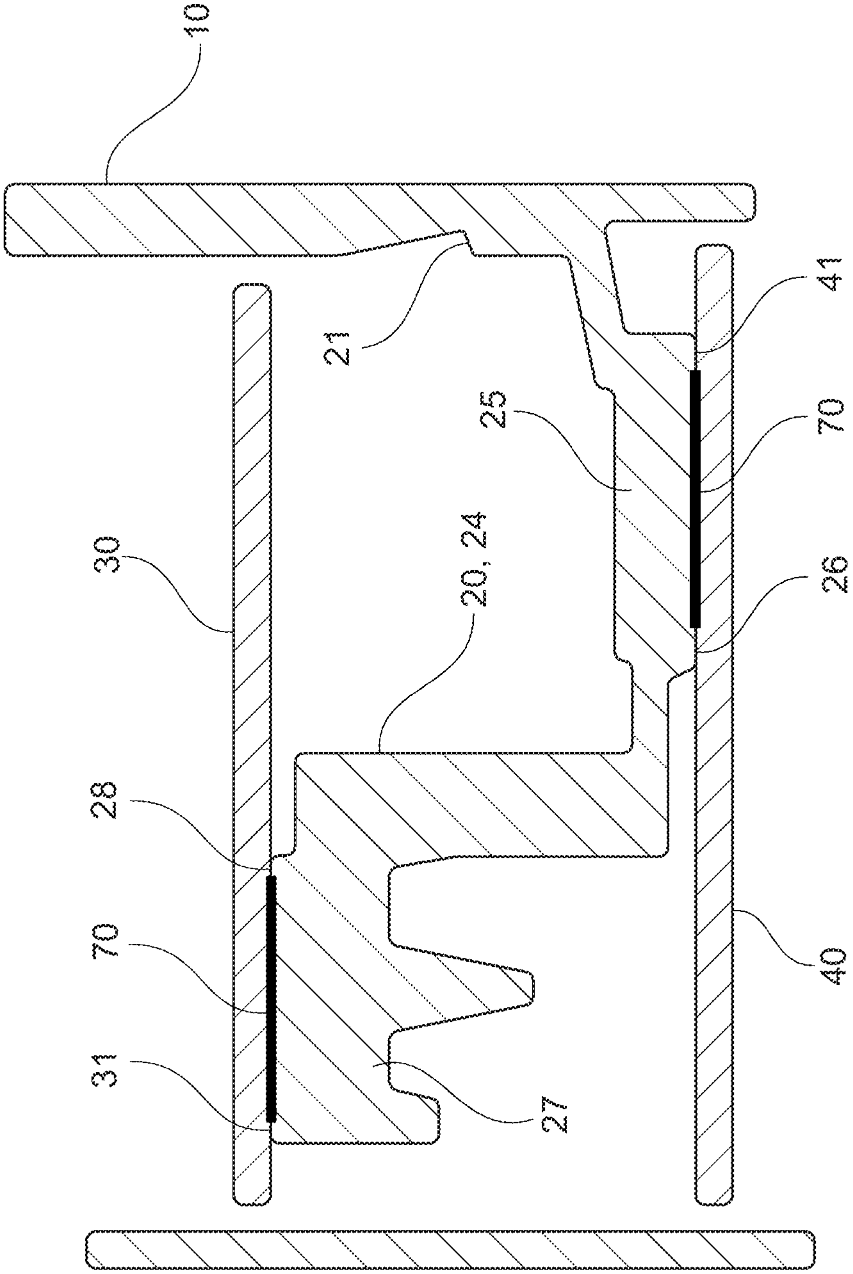
FIG. 4 is a schematic representation of a part of the electric power steering system of FIG. 1 showing an exemplary configuration of the printed circuit boards of the electric power steering system to the heat sink according to the invention.

As may be taken from FIG. 4, which shows a schematic representation of a part of the electric power steering system 200 of FIG. 1 showing an exemplary configuration of the two power boards 30, 40 with the heat sink 20. In this configuration, the first heat conduction surface 26 of the first heat conduction portion 25 is in close vicinity to a fourth heat conduction surface 41 of the second power board 40, whereas the second heat conduction surface 28 of the second heat conduction portion 27 is in close vicinity to a third heat conduction surface 31 of the first power board 30. In particular, the first heat conduction portion 25 may be attached to the fourth heat conduction surface 41 via a thermal interface material 70 and the second heat conduction surface 28 may be attached via the same thermal interface material 70 to the third heat conduction surface 31. An intermediate portion 24 of the heat sink 20 connecting the two heat conduction portions 25, 27 is generally extending in length along the length L of the housing 10. Thereby, both heat conduction surfaces 26, 28 of the heat sink 20 are thermally connected to corresponding heat conduction surfaces 31, 41 of the power boards 30, 40 and to each other by means of the heat conduction portions 25, 27 connected with each other via the intermediate portion 24.

By means of the diagonally opposing heat conduction surfaces 26, 28 of the heat sink 20 and the overall design or shape of the heat sink 20, a very effective heat conduction from the power boards 30, 40 to the housing 10 may be achieved making use of the entire or at least a large portion of the available body of the heat sink 20.

Figure 5:
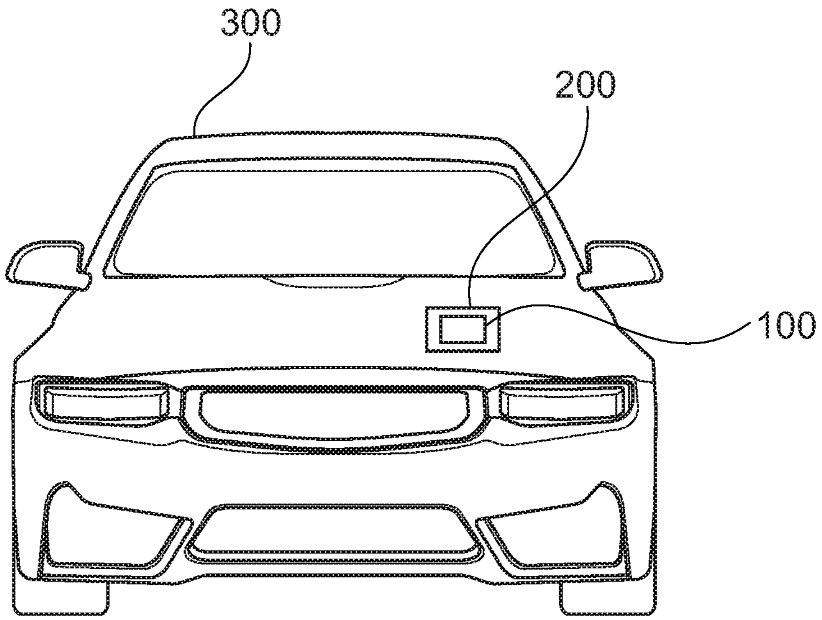
FIG. 5 is a front view on an automobile according to the invention.

Finally, FIG. 5 shows an exemplary vehicle 300 in the form of an automobile 300 according to the invention. The automobile 300 comprises the electric power steering system 200 of FIGS. 1 to 4 having the electronic control unit 100.

REFERENCE SIGNS

10 housing
20 heat sink
21 outer circumference
22 cut-out
23 recess, groove
24 intermediate portion
25 first heat conduction portion
26 first heat conduction surface
27 second heat conduction portion
28 second heat conduction surface
29 cross-section
30 first printed circuit board, first power board
31 third heat conduction surface
40 second printed circuit board, second power board
41 fourth heat conduction surface
50 electric unit, electric motor
60 connector system
100 electronic control unit
200 electric power steering system
300 vehicle, automobile
W width of the housing
L length of the housing

We claim:

1. An electronic control unit for a vehicle, the electronic control unit comprising:

a single piece housing including an electric unit, the housing comprising an outer wall having an inner circumference surrounding an open interior volume of the housing;

a heat sink positioned in the interior volume of the housing, the heat sink extending from a proximal end to a distal end, the proximal end joined to the inner circumference, the distal end terminating prior to the inner circumference opposite the proximal end and forming a gap between the inner circumference of the outer wall and the distal end, the heat sink comprising a first heat conduction surface on a first side of the heat sink and a second heat conduction surface on a second side of the heat sink;

a first printed circuit board electrically connected to the electric unit, wherein the first printed circuit board is positioned in the interior volume of the housing directly adjacent to the first heat conduction surface of the heat sink, the first printed circuit board attached to the first heat conduction surface via thermal interface material; and a second printed circuit board electrically connected to the electric unit, wherein the second printed circuit board is positioned in the interior volume of the housing directly adjacent to the second heat conduction surface of the heat sink, the second printed circuit board attached to the second heat conduction surface via thermal interface material;

wherein the heat sink is designed monolithically with the housing such that the heat sink conducts heat generated by the first printed circuit board and by the second printed circuit board to the outer wall of the housing.

2. The electronic control unit according to claim 1, wherein the first printed circuit board and the second printed circuit board are power boards for conducting current to the electric unit.

3. The electronic control unit according to claim 2, wherein the electronic control unit is an electronic control unit of an electric power steering system.

4. The electronic control unit according to claim 1, wherein the heat sink and the housing are made from the same metal.

5. The electronic control unit according to claim 1, wherein the heat sink is sandwiched between the first printed circuit board and the second printed circuit board.

6. The electronic control unit according to claim 1, wherein the first heat conduction surface is arranged diagonally opposite to the second heat conduction surface.

7. The electronic control unit according to claim 1, wherein the first heat conduction surface and the second heat conduction surface are located at different widths of the housing.

8. The electronic control unit according to claim 1, wherein the first heat conduction surface is located on a first heat conduction portion of the heat sink and the second heat conduction surface is located on a second heat conduction portion of the heat sink.

9. The electronic control unit according to claim 8, wherein the first heat conduction portion and the second heat conduction portion are connected to each other by an intermediate portion of the heat sink extending along a length (L) of the housing.

10. The electronic control unit according to claim 1, wherein the heat sink includes recesses and/or grooves configured to receive electronic components of at least one of the first printed circuit board and the second printed circuit board.

11. The electronic control unit according to claim 1, wherein the distal end of the heat sink cooperates with the inner circumference of the outer wall to define at least one cut-out for a connector of the electronic control unit.

12. The electronic control unit according to claim 1, wherein the outer wall of the housing has a cylindrical shape or a substantially cylindrical shape and the heat sink has a substantially circular plate-like shape.

13. An electric power steering system comprising:

the electronic control unit according to claim 1;

wherein the electric unit is an electric motor provided inside the interior volume of the housing and electrically connected to the first printed circuit board and to the second printed circuit board.

14. A vehicle comprising:

at least one of:

an electronic control unit comprising:

a single piece housing including an electric unit, the housing comprising an outer wall having an inner circumference surrounding an open interior volume of the housing;

a heat sink positioned in the interior volume of the housing, the heat sink extending from a proximal end to a distal end, the proximal end joined to the inner circumference, the distal end terminating prior to the inner circumference opposite the proximal end and forming a gap between the inner circumference of the outer wall and the distal end, the heat sink comprising a first heat conduction surface on a first side of the heat sink and a second heat conduction surface on a second side of the heat sink;

a first printed circuit board electrically connected to the electric unit, wherein the first printed circuit board is positioned in the interior volume of the housing directly adjacent to the first heat conduction surface of the heat sink, the first printed circuit board attached to the first heat conduction surface via thermal interface material; and a second printed circuit board electrically connected to the electric unit, wherein the second printed circuit board is positioned in the interior volume of the housing directly adjacent to the second heat conduction surface of the heat sink, the second printed circuit board attached to the second heat conduction surface via thermal interface material;

wherein the heat sink is designed monolithically with the housing such that the heat sink conducts heat generated by the first printed circuit board and by the second printed circuit board to the outer wall of the housing; and the electric power steering system according to claim 13.

* * * * *